United States Patent
Tamura et al.

(10) Patent No.: US 7,947,638 B2
(45) Date of Patent: May 24, 2011

(54) COMPOSITION FOR CLEANING SEMICONDUCTOR DEVICE

(75) Inventors: Atsushi Tamura, Wakayama (JP); Yasuhiro Doi, Wakayama (JP)

(73) Assignee: Kao Corporation, Tokyo (JP)

( * ) Notice: Subject to any disclaimer, the term of this patent is extended or adjusted under 35 U.S.C. 154(b) by 441 days.

(21) Appl. No.: 12/216,212

(22) Filed: Jul. 1, 2008

(65) Prior Publication Data
US 2008/0296767 A1    Dec. 4, 2008

Related U.S. Application Data

(62) Division of application No. 11/017,824, filed on Dec. 22, 2004, now Pat. No. 7,410,902.

(30) Foreign Application Priority Data

Dec. 24, 2003    (JP) ................................ 2003-427455

(51) Int. Cl.
*H01L 21/02*    (2006.01)
(52) U.S. Cl. ...................................... 510/175; 510/176
(58) Field of Classification Search .................. 510/175, 510/176
See application file for complete search history.

(56) References Cited

U.S. PATENT DOCUMENTS

| | | | |
|---|---|---|---|
| 5,234,542 A * | 8/1993 | Cordani ........................ 216/108 |
| 5,647,989 A | 7/1997 | Hayashi et al. | |
| 5,849,169 A * | 12/1998 | Aikawa et al. .................. 205/50 |
| 5,855,805 A | 1/1999 | Arabinick | |
| 5,962,385 A | 10/1999 | Maruyama et al. | |
| 5,972,862 A | 10/1999 | Torii et al. | |
| 6,998,352 B2 | 2/2006 | Aoki et al. | |
| 2003/0148624 A1 | 8/2003 | Ikemoto et al. | |
| 2003/0164471 A1 | 9/2003 | Small et al. | |

FOREIGN PATENT DOCUMENTS

| | | |
|---|---|---|
| EP | 0578507 A2 | 1/1994 |
| EP | 1638138 A1 | 3/2006 |
| JP | 58-132935 A | 8/1983 |

(Continued)

OTHER PUBLICATIONS

Full English translation of Japanese Patent Laid-Open No. Showa 58-132935, May 2009.

*Primary Examiner* — Gregory E Webb
(74) *Attorney, Agent, or Firm* — Birch, Stewart, Kolasch & Birch, LLP

(57) ABSTRACT

A sulfur-containing detergent composition for cleaning a semiconductor device having an aluminum wire, wherein the sulfur-containing detergent composition is capable of forming a protective film containing a sulfur atom on a surface of an aluminum film in a protective film-forming test; a semiconductor device comprising a protective film containing a sulfur atom on a surface of an aluminum wire, wherein sulfur atom is contained within a region of at least 5 nm in its thickness direction from the surface of the protective film; and method for manufacturing a semiconductor device, comprising the step of contacting an aluminum wire of the semiconductor device with the sulfur-containing detergent composition as defined above, thereby forming a sulfur-containing protective film on the surface of the aluminum wire. The semiconductor device can be suitably used in the manufacture of electronic parts such as LCD, memory and CPU. Especially, the semiconductor device is suitably used in the manufacture of a highly integrated semiconductor with advanced scale-down.

11 Claims, 1 Drawing Sheet

| | FOREIGN PATENT DOCUMENTS | |
|---|---|---|
| JP | 10-55993 A | 3/1989 |
| JP | 6-266119 A | 9/1994 |
| JP | 6-342793-A A | 12/1994 |
| JP | 9-279189 A | 10/1997 |
| JP | 10-41308 A | 2/1998 |
| JP | 11-67632 A | 3/1999 |
| JP | 2000273695 A * | 10/2000 |
| JP | 2003-100867 A | 4/2003 |
| JP | 2003-228180 A | 8/2003 |
| WO | WO-03/091377 A1 | 11/2003 |

* cited by examiner

COMPOSITION FOR CLEANING SEMICONDUCTOR DEVICE

CROSS-REFERENCE TO RELATED APPLICATIONS

The present application is a 37 C.F.R. §1.53(b) divisional of U.S. application Ser. No. 11/017,824 filed Dec. 22, 2004, now U.S. Pat. No. 7,410,902 which claims priority on Japanese Application No. 2003-427455 filed Dec. 24, 2003. The entire contents of both applications is hereby incorporated by reference.

FIELD OF THE INVENTION

The present invention relates to a semiconductor device having a protective film on a surface of an aluminum wire, and a method for manufacturing a semiconductor device including the step of forming the protective film.

Further, the present invention relates to a sulfur-containing detergent composition useful for cleaning a semiconductor device having an aluminum wire.

BACKGROUND OF THE INVENTION

In the manufacture of a semiconductor device on a semiconductor substrate such as a silicon wafer, a thin film is formed by a process such as spattering, and given patterns are formed with a resist on a thin film by lithography. The resist is used as an etching resist to remove the thin film of a lower part by selective etching, and thereafter the resist is removed by ashing, and residue generated after this etching or ashing are removed with a detergent. A series of these steps are repeated, whereby a manufactured article of a semiconductor device is manufactured.

On the other hand, with the increasing demands of high speeds and high integration of semiconductor devices, the aluminum wires have been progressively scaled-down, so that the wire widths tend to be narrower. However, when the wire width is narrow, the corrosion of the wire by the detergent used in the manufacture of the semiconductor devices is more likely to take place. Therefore, the tolerable level of the corrosion against the wire by the detergent has become very strict in recent years.

For instance, a detergent containing a fluorine-containing compound or an amine (for instance, JP-A-Hei-11-67632 and JP-A-Hei-6-266119), which has been presently widely used, does not satisfactorily meet the level demanded for the corrosion of the wires if the residue is attempted to be completely removed in semiconductor devices equipped with the wires having narrow widths as mentioned above.

In addition, as a detergent serving to suppress the corrosion of a metal film, there has been disclosed a detergent composition containing a quaternary ammonium salt or an ammonium salt of an organic carboxylic acid, ammonium fluoride, a water-soluble organic solvent, and an inorganic acid or organic acid (JP-A-Hei-10-55993). However, since there is a large amount of corrosion of the aluminum wire by ammonium fluoride in semiconductor devices equipped with the wires having narrow widths, the problems have not yet been solved thereby.

Therefore, in order to obtain a semiconductor substrate in which a semiconductor device equipped with the wires having a narrow wire width is formed, which is expected to be required more and more in the future. Particularly in an industrial scale, there are limitations in the contrivances of conventional detergent solutions.

SUMMARY OF THE INVENTION

The present invention relates to:

[1] a semiconductor device containing a protective film containing a sulfur atom on a surface of an aluminum wire, wherein sulfur atom is contained within a region of at least 5 nm in its thickness direction from the surface of the protective film;

[2] a semiconductor device having a sulfur-containing protective film formed by contacting an aluminum wire with a sulfur-containing detergent composition capable of forming a sulfur-containing protective film having a self-potential of from −0.45 to −0.25 V, thereby forming a sulfur-containing protective film on the surface of the aluminum wire;

[3] a method for manufacturing a semiconductor device, including the step of contacting an aluminum wire of the semiconductor device with a sulfur-containing detergent composition containing (i) an acid; (ii) a salt of an organic acid, a salt of an inorganic acid, or a mixture thereof, and (iii) water in an amount of at least 50% by weight, thereby forming a sulfur-containing protective film on the surface of the aluminum wire;

[4] a method for manufacturing a semiconductor device, including the step of contacting an aluminum wire with a sulfur-containing detergent composition capable of forming a sulfur-containing protective film having a self-potential of from −0.45 to −0.25 V, thereby forming a sulfur-containing protective film on the surface of the aluminum wire; and

[5] a sulfur-containing detergent composition for cleaning a semiconductor device having an aluminum wire, wherein the composition is capable of forming a protective film containing a sulfur atom on a surface of an aluminum film in a protective film-forming test.

Figure 1:
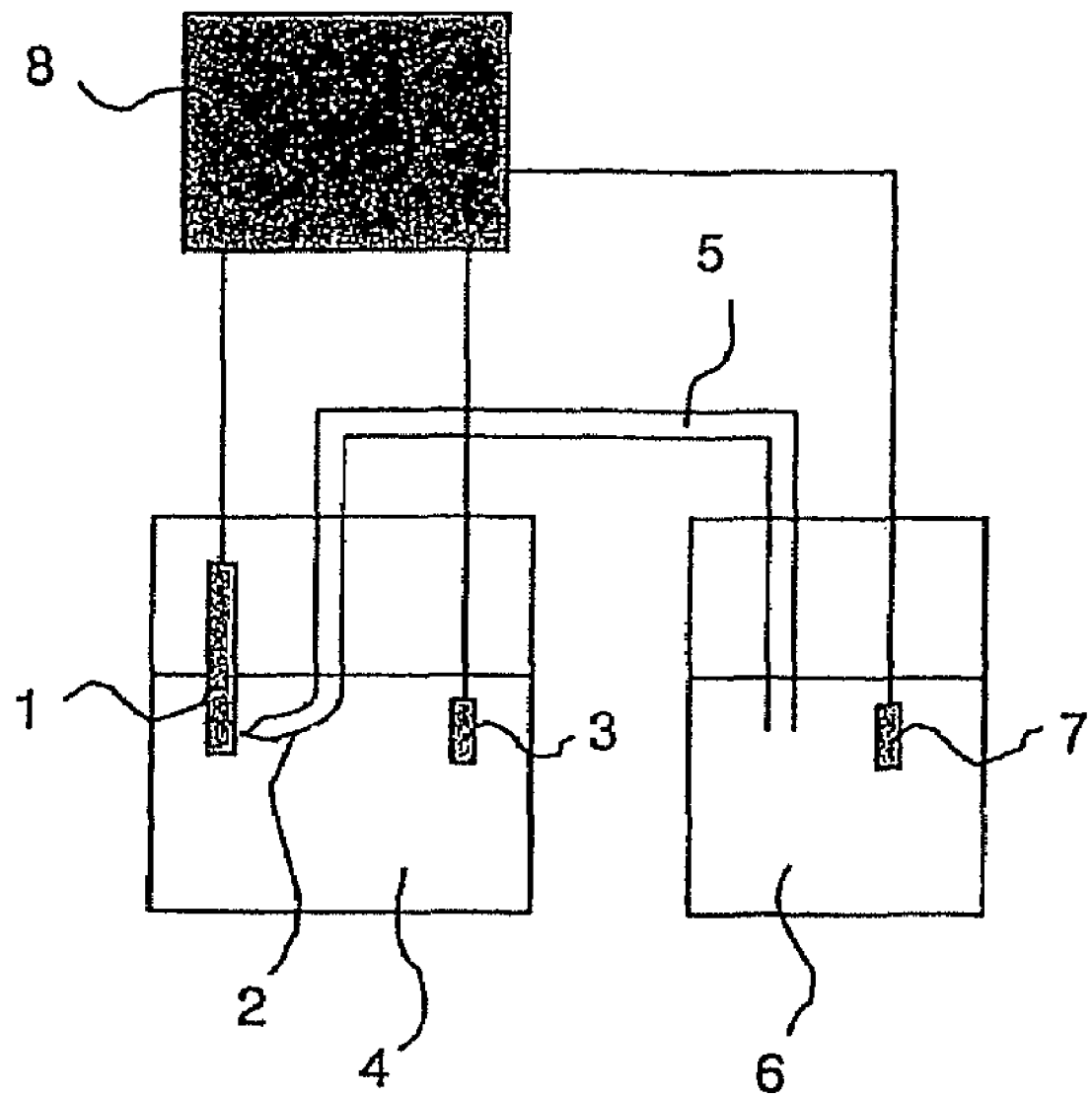
FIG. 1 is a schematic view of an electrochemical determination device used in the determination of self-potential of the protective film in Examples.

The reference numerals are as follows.

1 is a working electrode (aluminum film, thickness: 500 nm), 2 is a Luggin tube, 3 is a counter electrode (platinum), 4 is a determination vessel (detergent composition), 5 is a salt bridge, 6 is a reference electrode vessel (saturated aqueous potassium chloride), 7 is a calomel reference electrode, and 8 is a potential-current determination device.

DETAILED DESCRIPTION OF THE INVENTION

In view of the above, the present inventors have found a means of very easily forming a protective film on the surface of the semiconductor device, having resistance against the corrosion caused by the detergent. The present invention has been accomplished thereby.

The present invention relates to a semiconductor device having a protective film containing a sulfur atom on the surface of the aluminum wire, and a process for manufacturing the semiconductor device.

Further, the present invention relates to a sulfur-containing detergent composition to be used for cleaning a semiconductor device having an aluminum wire.

In the semiconductor device of the present invention, a sulfur-containing protective film having resistance against the corrosion on the surface of the aluminum wire is formed. By using the semiconductor device, there is exhibited an effect that a high-quality semiconductor device can be industrially manufactured at a low cost, wherein the semiconductor device has very little residue generated upon the formation of a semiconductor device and amount of aluminum corrosion being suppressed within a tolerable range.

Furthermore, the detergent composition of the present invention is capable of forming a sulfur-containing protective film having resistance against corrosion on the surface of the aluminum film in the protective film formation test. By using the detergent composition for cleaning a semiconductor device having an aluminum wire, there is exhibited an effect that a high-quality semiconductor device can be industrially manufactured at a low cost, wherein the semiconductor device has very little residue generated upon the formation of a semiconductor device and amount of aluminum corrosion being suppressed within a tolerable range.

Moreover, by using the semiconductor device of the present invention, a superior-grade electronic part such as LCD, memory or CPU can be manufactured without the generation of electric property failure such as increase in the resistance of the wire or increase in leakage current.

These and other advantages of the present invention will be apparent from the following description.

1. Semiconductor Device

The semiconductor device of the present invention is a semiconductor device having a protective film containing a sulfur atom (hereinafter also referred to as "sulfur-containing protective film") on a surface of an aluminum wire, and its feature resides in that a sulfur atom is contained within a region of at least 5 nm in its thickness direction from the surface of the protective film.

The sulfur-containing protective film in the present invention refers to a portion at which a sulfur atom is detected by elemental analysis such as X-ray spectroscopy.

In addition, the phrase "contains a sulfur atom within a region of at least 5 nm in its thickness direction from the surface of the protective film" in the sulfur-containing protective film, or a grammatical variation thereof, means a state in which a sulfur atom is contained within a region of at least 5 nm in the direction from the surface of the sulfur-containing protective film formed on the surface of the aluminum wire to the central portion of the aluminum wire vertical to the surface, the state of which can be confirmed by elemental analysis such as X-ray spectroscopy.

In addition, the formation of the above-mentioned protective film may be confirmed by determining its self-potential. Specifically, it is considered that the protective film is formed if the above-mentioned protective film has a self-potential of from −0.45 to −0.25V. The method for determination includes the method as described in Examples set forth below. This self-potential is greater than the self-potential of aluminum, and includes the range of the self-potential of the alumite group.

In addition, the sulfur atom content in the sulfur-containing protective film in the present invention is preferably from 0.1 to 20% by weight, more preferably from 1 to 20% by weight, even more preferably from 2 to 20% by weight, even more preferably from 5 to 20% by weight, even more preferably from 10 to 20% by weight, from the viewpoint of corrosion resistance against aluminum caused by a detergent. Even more preferably, the sulfur atom content in the sulfur-containing protective film is preferably from 0.1 to 20% by weight, more preferably from 1 to 20% by weight, even more preferably from 2 to 20% by weight, even more preferably from 5 to 20% by weight, even more preferably from 10 to 20% by weight, within a region of 5 nm in its thickness direction from the surface of the protective film, from the viewpoint of corrosion resistance against aluminum caused by a detergent.

The component other than the sulfur atom in the sulfur-containing protective film includes an aluminum atom, an oxygen atom and the like. The content of these components in the sulfur-containing protective film is preferably from 80 to 99% by weight, more preferably from 80 to 95% by weight, even more preferably from 80 to 90% by weight.

The sulfur-containing protective film has a thickness of preferably from 1 to 10 nm, more preferably from 3 to 8 nm.

In addition, the semiconductor device of the present invention, as mentioned above, contains an aluminum wire, and other wire metal such as copper, titanium or tungsten may be contained. The shape of the wire is not particularly limited, and any known ones can be used.

The wire width of the aluminum wire or the like is not particularly limited, and any of wire widths such as 500 nm, 250 nm, 180 nm, 130 nm, 110 nm, 90 nm, and 70 nm can be employed. Among them, in the case where the scaled-down wire is 180 nm or less of which amount of tolerable corrosion is strict, the wire protective effects are remarkable as compared to conventional detergent.

In the semiconductor device of the present invention, the constituting members other than the sulfur-containing protective film and the aluminum wire mentioned above may be known ones without particular limitation.

2. Sulfur-Containing Detergent Composition

In the present invention, the above-mentioned sulfur-containing protective film can be formed on the surface of the aluminum wire by contacting the above-mentioned aluminum wire with a sulfur-containing detergent composition containing (i) an acid, (ii) a salt of an organic acid, a salt of an inorganic acid, or a mixture thereof, and (iii) water in an amount of at least 50% by weight of the sulfur-containing detergent composition.

By using the sulfur-containing detergent composition, there can be satisfied both excellent cleaning ability and corrosion resistance against an aluminum wire in which a sulfur-containing protective film is very easily formed on the surface of the aluminum wire.

Here, the sulfur-containing detergent composition usable in the present invention is different from a detergent for removing particles generated upon polishing or the like of a silicon wafer substrate, or for removing particles and metal impurities after chemical-mechanical-polishing for connecting between wires (CMP polishing).

In addition, it is preferable that the sulfur-containing detergent composition in the present invention does not essentially contain a fluorine-containing compound from the viewpoint that its corrosion resistance against the wire is not lowered even when the detergent composition is diluted with water, and the problem of wastewater treatment is not generated. Especially, in an aqueous detergent composition which can be obtained by mixing a fluorine-containing compound such as hydrogen fluoride, ammonium fluoride, an amine salt of hydrofluoric acid, there is a tendency that the corrosion of a metal is more notably generated as the content of water increases. Therefore, it is preferable that the composition of the present invention essentially does not contain a fluorine-containing compound. Specifically, the content of the fluorine-containing compound in the composition is preferably 0.1% by weight or less, more preferably 0.05% by weight or less, even more preferably 0.01% by weight or less, even more preferably 0.001% by weight or less, even more preferably not containing any fluorine-containing compounds.

In addition, the sulfur-containing detergent composition in the present invention preferably does not essentially contain an inorganic base containing a metal atom such as NaOH, from the viewpoint of reducing the adhesion of metal impurities. Specifically, the content of NaOH in the composition is preferably 100 ppb or less, more preferably 50 ppb or less, even more preferably 20 ppb or less, even more preferably not containing any inorganic bases.

The above-mentioned sulfur-containing detergent composition is, for instance, contacted with the aluminum wire upon cleaning the residue generated after the ashing step through photolithograph step and the etching step of the aluminum wire, whereby a sulfur-containing protective film can be formed on the surface of the aluminum wire.

The acid is preferably oxalic acid, 1-hydroxyethylidene-1,1-diphosphonic acid, sulfuric acid, nitric acid and phosphonic acid, from the viewpoint of the ability of dissolving the residue generated upon the formation of the aluminum wire (hereinafter simply referred to as "residue"), and solubility in water. Oxalic acid, sulfuric acid and phosphonic acid are more preferable, and oxalic acid and sulfuric acid are even more preferable. These acids can be used alone or in admixture of two or more kinds.

The content of the acid in the sulfur-containing detergent composition is preferably from 0.01 to 10% by weight, more preferably from 0.05 to 5% by weight, even more preferably from 0.1 to 2% by weight, from the viewpoint of solubility in water, corrosion resistance against aluminum and ability of dissolving the residue.

In addition, the salt of an organic acid and the salt of an inorganic acid are preferably ammonium oxalate, ammonium sulfate and ammonium nitrate from the viewpoint of effective formation of the sulfur-containing protective film on the surface of aluminum wire by the combination with the above-mentioned acids, and high water solubility. These salts can be used alone or in admixture of two or more kinds.

The content of the salt of an organic acid and the salt of an inorganic acid in the above-mentioned sulfur-containing detergent composition is preferably from 1 to 20% by weight, more preferably from 2 to 15% by weight, even more preferably from 3 to 10% by weight, from the viewpoint of solubility in water and corrosion resistance against aluminum.

The weight ratio of the acid (i) to the salt of an organic acid, the salt of an inorganic acid, or a mixture thereof (ii) (acid/salt) in the above-mentioned sulfur-containing detergent composition is preferably from 1/100 to 5/1, more preferably from 1/50 to 2/1, even more preferably from 1/25 to 1/2, from the viewpoint of satisfying both cleaning ability and corrosion resistance against aluminum.

In addition, as the combination of the acid (i) and the salt of an organic acid, the salt of an inorganic acid, or a mixture thereof (ii) in the above-mentioned sulfur-containing detergent composition, when an acid other than sulfuric acid is used as the acid, the detergent composition preferably contains at least ammonium sulfate as the salt of an inorganic acid in order to form the sulfur-containing protective film on the surface of the aluminum wire.

Water in the above-mentioned sulfur-containing detergent composition is used as a solvent for homogeneously dissolving the acid (i) and the salt of an organic acid, the salt of an inorganic acid, or a mixture thereof (ii). For instance, ultrapure water, pure water, ion-exchanged water, distilled water or the like can be used.

The content of water mentioned above in the above-mentioned composition is preferably from 50 to 98.99% by weight, more preferably from 60 to 97.95% by weight, even more preferably from 68 to 96.9% by weight, of the detergent composition, from the viewpoint of homogeneously dissolving the acid (i) and the salt of an organic acid, the salt of an inorganic acid, or a mixture thereof (ii).

In addition, as other components for the sulfur-containing detergent composition, a solvent such as dimethyl sulfoxide or glycol ether, or anti-corrosive agent such as catechol or sorbitol may be added as occasion demands, besides the acid (i), the salt of an organic acid, the salt of an inorganic acid, or a mixture thereof (ii) and water.

Here, the concentration of each component in the above-mentioned sulfur-containing detergent composition is a preferable concentration upon use. Upon use of the sulfur-containing detergent composition, a concentrated product can, for instance, be diluted and used.

The pH of the sulfur-containing detergent composition having the components is preferably from 1 to 5, more preferably from 1 to 3, from the viewpoint of satisfying both the ability of cleaning the residue and corrosion resistance against the aluminum wire.

The above-mentioned sulfur-containing detergent composition can be obtained by mixing (i) the acid, (ii) the salt of an organic acid, the salt of an inorganic acid, or a mixture thereof, (iii) water, which are mentioned above, and other components as occasion demands by a known method.

In addition, the sulfur-containing protective film formed by the contact of the above-mentioned sulfur-containing detergent composition and the aluminum wire can evaluate its properties by determining its self-potential, and it has been found that there is a large effect for the corrosion resistance against aluminum when the self-potential is from −0.45 to −0.25 V.

In other words, in one embodiment, the present invention relates to a semiconductor device having a sulfur-containing protective film formed by contacting an aluminum wire of the semiconductor device with a sulfur-containing detergent composition capable of forming a sulfur-containing protective film having a self-potential of from −0.45 to −0.25 V, thereby forming a sulfur-containing protective film on the surface of the aluminum wire.

The above-mentioned self-potential is more preferably from −0.4 to −0.3 V, from the viewpoint of satisfying both the ability of cleaning the residue and corrosion resistance against the aluminum wire. Here, the self-potential can be determined in accordance with the method described in Examples set forth below.

It is preferable to use the above-mentioned sulfur-containing detergent composition, because cleaning of the residue and formation of the sulfur-containing protective film can be simultaneously carried out. For instance, the above-mentioned sulfur-containing detergent composition can be used in any of the steps in the manufacturing steps for the semiconductor device, specifically the step of manufacturing a semiconductor device, such as a step after resist development, a step after dry etching, a step after wet etching, a step after ashing or the like. Among them, the sulfur-containing detergent composition is used in the cleaning step after ashing from the viewpoint of satisfying cleaning ability and corrosion resistance against aluminum.

The method of contacting the above-mentioned sulfur-containing detergent composition and the aluminum wire may be an ordinary cleaning process for a semiconductor device, such as immersion cleaning, spray cleaning or the like. For instance, there can be employed an immersion cleaning process or reciprocation cleaning process, in which a semiconductor device is, for instance, immersed in a sulfur-containing detergent composition for about 5 minutes.

In addition, the temperature of the sulfur-containing detergent composition upon cleaning is preferably within a range of from 20° to 60° C., from the viewpoint of its ability of dissolving the residue generated upon the formation of the aluminum wire, corrosion resistance against aluminum, safety and operability. Here, other factors such as a cleaning device are not particularly limited.

The sulfur-containing protective film formed by the method as described above is formed on the surface of the aluminum wire. The protective film exhibits excellent properties of being capable of preventing corrosion of the aluminum wire while stripping away the residue generated after etching or ashing, when the aluminum wire is exposed to a cleaning solution.

Although not wanting to be limited by theory, the detailed mechanisms for exhibiting the properties as described above are not elucidated but are presumably as follows. For instance, when the above-mentioned sulfur-containing detergent composition is contacted with substances to be cleaned such as residue, the surface of the aluminum wire on which the composition is contacted is modified, thereby incorporating a sulfur atom in the modified portion, thereby forming a sulfur-containing protective film, while stripping away these substances.

The above-mentioned sulfur-containing detergent composition can be obtained by mixing an acid (i), a salt of an organic acid, a salt of an inorganic acid, or a mixture thereof (ii), and water (iii) in an amount of at least 50% by weight.

Further, taking the composition from a different angle, the composition comprises a conjugated base of a molecular acid, a conjugated acid of a molecular base, and water in an amount of at least 50% by weight, wherein an amount of alumina dissolved is 10 ppm or more in a standard test.

The procedures for the standard test employed in the present invention are as follows.
1) A 100 ml polyethylene vessel is charged with 20 g of a detergent composition, and kept at a constant temperature in a thermostat at 40° C.
2) Next, 0.1 g of alumina powder (commercially available from Fujimi Corporation under the trade name of "WA-10000"; average particle size: 0.5 μm) is added thereto, and the mixture is stirred thoroughly for 30 minutes.
3) Ten grams of the supernatant is collected in a centrifugal tube, and separation is carried out with a centrifugal separator (commercially available from HITACHI Ltd. under the trade name of "himac CP56G") at 20000 r/min for 15 minutes, the supernatant obtained therefrom is used to determine an emission intensity of aluminum with an ICP emission spectrophotometer (commercially available from HORIBA, Ltd. under the trade name of "JY238").
4) The amount of alumina dissolved is obtained from a calibration curve prepared from aqueous aluminum solutions of known concentrations.

Here, from the viewpoint of more favorably carrying out the determination, the determination of emission intensity of aluminum in 3) is carried out by diluting the supernatant 10 folds with ultrapure water, and when a found value exceeds the range of the calibration curve (0 to 2 ppm), the mixture is diluted 10-folds again and determined. In addition, in 4), a solution is prepared by diluting an aqueous aluminum solution (1000 ppm) with ultrapure water to give a 10000-fold diluted solution (0.1 ppm), and a 500-fold diluted solution (2.0 ppm), respectively, and each solution is subjected to atomic absorption analysis to prepare a calibration curve (3-point calibration).

The amount of alumina dissolved by the sulfur-containing detergent composition of the present invention in the standard test is preferably 10 ppm or more. The amount of alumina dissolved is more preferably 12 ppm or more, even more preferably 15 ppm or more, from the viewpoint of increasing cleaning ability.

The molecular acid in the present invention is a Brønsted acid in the form of a molecule. The molecular acid includes, for instance, inorganic acids such as phosphonic acid, sulfuric acid, nitric acid, phosphoric acid and hydrochloric acid; and organic acids such as organic sulfuric acids, organophosnonic acids and carboxylic acids.

The conjugated base of a molecular acid includes a phosphonate ion which is a conjugated base of a phosphonic acid; a hydrogensulfate ion and a sulfate ion which are conjugated bases of sulfuric acid; a nitrate ion which is a conjugated base of nitric acid; a hydrogenphosphate ion and a phosphate ion which are conjugated bases of phosphoric acid; a chloride ion which is a conjugated base of hydrochloric acid; a methylsulfate ion which is a conjugated base of methylsulfuric acid; a 1-hydroxyethylidene-1,1-diphosphonate ion which is a conjugated base of 1-hydroxyethylidene-1,1-diphosphonic acid; an acetate ion which is a conjugated base of acetic acid; an oxalate ion which is a conjugated base of oxalic acid; a sulfonate ion which is a conjugated base of sulfonic acid; and the like. Among them, the conjugated bases of a molecular acid are preferably an oxalate ion, a 1-hydroxyethylidene-1,1-diphosphonate ion, a sulfate ion, a nitrate ion and a phosphonate ion, more preferably an oxalate ion, a sulfate ion and a phosphonate ion, even more preferably an oxalate ion and a sulfate ion, even more preferably a sulfate ion, from the viewpoint of ability of dissolving the residue generated upon the formation of the aluminum wire and solubility in water.

The molecular base in the present invention is a Brønsted base in the form of a molecule. The molecular base includes, for instance, ammonia, alkylamines, hydroxylamines, alkanolamines, polyamines, aromatic amines, alkylammonium hydroxides, alkyl monoamines, cyclic amines and the like.

The conjugated acid of a molecular base includes an ammonium ion which is a conjugated acid of ammonia; an alkylammonium ion which is a conjugated acid of an alkylamine; a hydroxylammonium ion which is a conjugated acid of a hydroxylamine; an alkanolammonium ion which is a conjugated acid of an alkanolamine; a polyammonium ion which is a conjugated acid of a polyamine; an aromatic ammonium ion which is a conjugated acid of an aromatic amine; a quaternary ammonium ion which is a conjugated acid of an alkylammonium hydroxide; a cyclic ammonium ion which is a conjugated acid of a cyclic amine; and the like.

The combination of the conjugated base and the conjugated acid is preferably a combination of a conjugated base having a sulfur atom, other conjugated base, and a conjugated acid, from the viewpoint of forming a protective film containing a sulfur atom. The combination is more preferably one or more members selected from the group consisting of a sulfate ion and a hydrogensulfate ion, one or more members selected from the group consisting of an oxalate ion, a phosphonate ion, a 1-hydroxyethylidene-1,1-diphosphonate ion and a nitrate ion, and an ammonium ion, even more preferably a combination of a sulfate ion, at least one member selected from the group consisting of an oxalate ion and a phosphonate ion, and an ammonium ion, even more preferably a combination of a sulfate ion, an oxalate ion and an ammonium ion, from the viewpoint of corrosion resistance against the aluminum wire.

The sulfur-containing detergent composition in the present invention can be preferably obtained by mixing a conjugated base of a molecular acid, a conjugated acid of a molecular base, and water, and other additives mentioned above as occasion demands by a known method.

In this embodiment, the above-mentioned conjugated base may be derived from an acid, derived from a salt of an acid, or derived from a salt of a base. In addition, the above-mentioned conjugated acid may be derived from a base, derived from a salt of a base, or derived from a salt of an acid. For instance, when a sulfur-containing detergent composition is prepared by mixing a nitrate ion ($NO^{3-}$) and an ammonium ion ($NH_4^+$), the nitrate ion may be a nitrate ion derived from nitric acid ($HNO_3$), which is an acid, or may be a nitrate ion derived from ammonium nitrate ($NH_4NO_3$), which is a salt of an acid and also a salt of a base. The ammonium ion may be an ammonium ion derived from ammonia ($NH_3$), which is a base, or may be an ammonium ion derived from ammonium nitrate ($NH_4NO_3$), which is a salt of a base and also a salt of an acid.

It is preferable that the above-mentioned conjugated base and the above-mentioned conjugated acid are derived from an acid such as oxalic acid, 1-hydroxyethylidene-1,1-diphosphonic acid, sulfuric acid, nitric acid or phosphonic acid, and derived from a salt of an organic acid and a salt of an inorganic acid, such as ammonium oxalate, ammonium sulfate or ammonium nitrate.

In this embodiment, the acid is preferably oxalic acid, 1-hydroxyethylidene-1,1-diphosphonic acid, sulfuric acid, nitric acid and phosphonic acid, more preferably oxalic acid, sulfuric acid and phosphonic acid, even more preferably oxalic acid and sulfuric acid, from the viewpoint of ability of dissolving the residue generated upon the formation of the aluminum wire (hereinafter simply referred to as "residue") and solubility in water. These acids can be used alone or in admixture of two or more kinds. When the acid is used alone, sulfuric acid is preferable, and when the acids are used in admixture of two or more kinds, a combination of sulfuric acid and at least one member selected from the group consisting of oxalic acid, 1-hydroxyethylidene-1,1-diphosphonic acid, nitric acid and phosphonic acid is preferable.

The salt of an organic acid and the salt of an inorganic acid are preferably an oxalate, a sulfate and a nitrate from the viewpoint of effective formation of the sulfur-containing protective film on the surface of the aluminum wire by the combination with the above-mentioned acids and high water solubility. The salt of an organic acid and the salt of an inorganic acid mentioned above can be used alone or in admixture of two or more kinds. When the salt of an inorganic acid is used alone, the sulfate is preferable, and when the salt of an organic acid and the salt of an inorganic acid is used admixture of two or more kinds, a combination of a sulfate and at least one member selected from the group consisting of an oxalate and a nitrate is preferable.

The sulfate includes, for instance, a salt of sulfuric acid with ammonium, propanediamine, methyldiethanolamine, a hydroxy compound of tetramethylammonium, or the like. The oxalate includes, for instance, a salt of oxalic acid with ammonium, propanediamine, methyldiethanolamine, a hydroxy compound of tetramethylammonium, or the like. The nitrate includes, for instance, a salt of nitric acid with ammonium, propanediamine, methyldiethanolamine, a hydroxy compound of tetramethylammonium, or the like.

The combination of the above-mentioned acid and the salt of an organic acid, the salt of an inorganic acid, or a mixture thereof is preferably a combination where the acid is sulfuric acid, and the salt of an inorganic acid is a sulfate, a nitrate or a mixture thereof; a combination where the acid is both sulfuric acid and oxalic acid, and the salt of an inorganic acid is a sulfate; or a combination where the acid is both 1-hydroxyethylidene-1,1-diphosphonic acid and oxalic acid, and the salt of an inorganic acid is a sulfate.

It is preferable that the preferred contents of the above-mentioned conjugated base and the above-mentioned conjugated acid are contents corresponding to the content of the conjugated base and the conjugated acid contained in the acid of the preferred content mentioned above, and the salt of an organic acid, the salt of an inorganic acid, or a mixture thereof of the preferred content mentioned above.

As described above, the present invention further provides a sulfur-containing detergent composition used for cleaning a semiconductor device having an aluminum wire, wherein the composition is capable of forming a protective film containing a sulfur atom on a surface of an aluminum film in a protective film-forming test. Here, the protective film-forming test can be conducted in accordance with the method described in Examples set forth below.

It is preferable that the sulfur-containing protective film formed on the surface of the aluminum film by the above-mentioned sulfur-containing detergent composition has a self-potential of from −0.45 to −0.25 V, from the viewpoint of obtaining an excellent effect of corrosion resistance against aluminum.

In one embodiment, it is preferable that the above-mentioned sulfur-containing detergent composition contains an acid (i), a salt of an organic acid, a salt of an inorganic acid, or a mixture thereof (ii), and water (iii) in an amount of at least 50% by weight.

Specifically, the above-mentioned sulfur-containing detergent composition can be preferably obtained by mixing an acid (i), a salt of an organic acid, a salt of an inorganic acid, or a mixture thereof (ii), and water (iii) in an amount of at least 50% by weight.

In the above-mentioned sulfur-containing detergent composition, it is preferable that the acid (i) is at least one member selected from the group consisting of oxalic acid, 1-hydroxyethylidene-1,1-diphosphonic acid, sulfuric acid, nitric acid and phosphonic acid. In addition, it is preferable that the salt of an organic acid, the salt of an inorganic acid, or a mixture thereof (ii) is at least one member selected from the group consisting of ammonium oxalate, ammonium sulfate and ammonium nitrate.

Among them, it is more preferable that the acid (i) is sulfuric acid alone, or a combination of sulfuric acid and at least one member selected from the group consisting of oxalic acid, 1-hydroxyethylidene-1,1-diphosphonic acid, nitric acid and phosphonic acid. In addition, it is more preferable that the salt of an inorganic acid is a sulfate alone, or a combination of a sulfate and at least one member selected from an oxalate and a nitrate.

The preferred combinations of the acid and the salt of an inorganic acid are those wherein:

(I) the acid is sulfuric acid, and the salt of an inorganic acid is a sulfate, a nitrate, or a mixture thereof;

(II) the acid is both sulfuric acid and oxalic acid, and the salt of an inorganic acid is a sulfate; or (III) the acid is both 1-hydroxyethylidene-1,1-diphosphonic acid and oxalic acid, and the salt of an inorganic acid is a sulfate.

The above-mentioned sulfur-containing detergent composition has a pH of preferably from 1 to 5, from the viewpoint of satisfying both the ability of cleaning the residue and corrosion resistance against the aluminum wire.

In another embodiment, the above-mentioned sulfur-containing detergent composition preferably contains a conjugated base of a molecular acid, a conjugated acid of a molecular base, and water in an amount of at least 50% by weight, wherein an amount of alumina dissolved is 10 ppm or less in a standard test. Here, the standard test can be conducted in accordance with the method mentioned above.

In the above-mentioned sulfur-containing detergent composition, at least one of the conjugated bases of molecular acids is preferably a sulfate ion, more preferably the conjugated bases are a sulfate ion and at least one member selected from the group consisting of an oxalate ion, a 1-hydroxyethylidene-1,1-diphosphonate, a nitrate ion and a phosphonate ion.

The conjugated acid of a molecular base contained in the above-mentioned sulfur-containing detergent composition includes conjugated acids mentioned above.

The above-mentioned sulfur-containing detergent composition has a pH of preferably from 1 to 5, from the viewpoint of satisfying both the ability of cleaning the residue and corrosion resistance against the aluminum wire.

3. Method for Manufacturing Semiconductor Device

A feature of the method for manufacturing a semiconductor device of the present invention resides in that the method includes the step of contacting an aluminum wire with a sulfur-containing detergent composition, wherein the composition contains an acid (i), a salt of an organic acid, a salt of an inorganic acid, or a mixture thereof (ii), and water (iii) in an amount of at least 50% by weight, or the composition is capable of forming a sulfur-containing protective film having a self-potential of from −0.45 to −0.25 V, thereby forming a sulfur-containing protective film on the surface of the aluminum wire. In addition, a feature of the preferred method for manufacturing a semiconductor device of the present invention resides in that the method includes the step of contacting a surface of an aluminum film and a sulfur-containing detergent composition capable of forming a sulfur-containing protective film in a protective film-forming test, thereby forming a sulfur-containing protective film on the surface of the aluminum film.

The sulfur-containing detergent composition, the aluminum wire, the sulfur-containing protective film and the method of contacting the composition and the aluminum wire may be the same as those described above. In addition, the steps other than the step of forming a sulfur-containing protective film may be known ones. The sulfur-containing detergent composition capable of forming a sulfur-containing protective film on the surface of the aluminum film in a protective film-forming test may be the same as that described above.

The semiconductor device which can be obtained in accordance with the manufacturing method has little residue generated upon the formation of the aluminum wire and little corrosion of aluminum. Therefore, the semiconductor device can be suitably used in the manufacture of a superior-grade electronic part such as LCD, memory and CPU without causing failures in electric properties such as elevation in wire resistance and an increase in leak current. Especially, the semiconductor device is suitably used in the manufacture of highly integrated semiconductor with advanced scale-down.

EXAMPLES

The following examples further describe and demonstrate embodiments of the present invention. The examples are given solely for the purposes of illustration and are not to be construed as limitations of the present invention.

Examples 1 to 8 and Comparative Examples 1 to 5

1. Preparation of Detergent Compositions

The detergent compositions (numerical values are % by weight) having the following components were prepared, and used for the following cleaning process (step of forming a protective film).

Example 1 oxalic acid/ammonium sulfate/ultrapure water=0.2/4.0/95.8;

Example 2 oxalic acid/ammonium sulfate/ultrapure water=0.2/10.0/89.8;

Example 3 oxalic acid/ammonium sulfate/ultrapure water=2.0/2.0/96.0

Example 4

1-hydroxyethylidene-1,1-diphosphonic acid/ammonium sulfate/ultrapure water=0.2/2.0/97.8

Example 5 sulfuric acid/ammonium nitrate/ultrapure water=0.2/4.0/95.8

Example 6 oxalic acid/sulfuric acid/ammonium sulfate/ultrapure water=0.2/0.2/4.0/95.6

Example 7 oxalic acid/ammonium sulfate/diethylene glycol monobutyl ether/sorbitol/ultrapure water=0.2/4.0/30.0/5.0/60.8

Example 8

1-hydroxyethylidene-1,1-diphosphonic acid/ammonium sulfate/ultrapure water=0.2/4.0/95.8

Comparative Example 1 oxalic acid/ultrapure water=0.2/99.8

Comparative Example 2 ammonium sulfate/ultrapure water=4.0/96.0

Comparative Example 3 ammonium fluoride/dimethylformamide/ultrapure water=0.5/75.0/24.5

Comparative Example 4 hydroxylamine/2-amino-2-ethoxyethanol/catechol/ultrapure water=20/55/5/20

Comparative Example 5 ammonium fluoride/acetic acid/dimethylformamide/tetramethylammonium acetate/ultrapure water=10.0/0.1/45.0/3.0/41.9

2. Semiconductor Wafer

A patterned wafer having aluminum (Al) wires having wire widths of 500 nm, 180 nm, and 110 nm but not being subjected to cleaning and removal of residue generated during the formation of the aluminum wires was cut into pieces of 1 cm each side, and subjected to a cleaning process. Here, the structure of the wires was as follows.

TiN/Al—Cu/TiN/SiO$_2$/base layer

3. Cleaning Process (Evaluations for Cleaning Ability and Corrosion Resistance Against Aluminum Wire)

The cut patterned wafers were cleaned and evaluated under the following conditions.
(1) Cleaning: The wafer was immersed in 30 ml of a detergent composition at 40° C. for 30 minutes, and allowed to stand, provided that the wafer was immersed at 25° C. for 30 minutes in Comparative Examples 3 and 5, and that the wafer was immersed at 65° C. for 30 minutes in Comparative Example 4.
(2) Rinsing: The wafer was taken out from the detergent composition, and immersed in 30 ml of ultrapure water at 25° C. for 1 minute, and thereafter the same procedures were repeated for the wafer that was taken out therefrom.
(3) Evaluation: The rinsed wafer was dried with nitrogen blow, and thereafter, the evaluations for ability of cleaning the residue and corrosion resistance against the aluminum wire were made with FE-SEM (field emission scanning electron microscope) under a magnification of 50,000-folds to 100,000-folds in the following four ranks.

<Cleaning Ability>
◉: No residue is confirmed at all;
○: Very slight amount of the residue is confirmed;
Δ: Residue is partly confirmed; and
x: Much residue is confirmed.

<Corrosion Resistance Against Aluminum (Al) Wires>
◉: Both pitting and corrosion of Al wires are not confirmed at all;
○: Fine pitting is partly generated in Al wires;
Δ: Corrosion of Al wires is partly generated; and
x: Corrosion of Al wires is generated.

Here, acceptable products are those which are ranked as ◉ or ○ for both the cleaning ability and the corrosion resistance against aluminum wires.

4. Determination of Self-Potential of Protective Film Formed by Detergent Composition An ability of forming a protective film of the detergent composition was evaluated as follows.

Test of Protective Film Formation
(1) Preparation of Test Aluminum Film

A TiN film (50 nm) was formed on a silicon substrate, and an aluminum film (500 nm) was formed thereon by chemical vapor deposition (CVD). The substrate obtained was cut into a size of 15 mm×50 mm, to give a sample for determination.
(2) Pretreatment of Sample (Removal of Natural Oxidation Film)

The above-mentioned aluminum film was immersed in a 0.5% by weight diluted hydrofluoric acid at room temperature for 10 seconds, thereafter rinsed with ultrapure water, and dried with nitrogen blow.
(3) Determination of Self-Potential of Protective Film The above-mentioned pretreated aluminum film was immediately immersed in the detergent composition prepared in 1. mentioned above (300 ml, 40° C., provided that the pretreated aluminum film was immersed at 25° C. in Comparative Examples 3 and 5 and at 65° C. in Comparative Example 4) placed in a determination vessel of the electrochemical determination device shown in FIG. 1 (sample area to be immersed being 15 mm×15 mm). The self-potential with the passage of time was monitored with a potentiostat (potential-current determination device, "HAB-151" commercially available from Hokuto Denshi K.K.), and the value after 60 minutes from immersion is shown in the table.

As shown in FIG. 1, the electrochemical determination device has a potential-current determination device 8 equipped with a working electrode (aluminum film: thickness 500 nm) 1, a counter electrode (platinum) 3 and calomel reference electrode 7. Among these electrodes, the working electrode 1 and the counter electrode 3 are arranged inside the determination vessel 4, and the calomel reference electrode 7 was arranged inside a reference electrode vessel 6. The determination vessel 4 and the reference electrode vessel 6 were connected with a Luggin tube 2 (located on the side of the determination vessel 4) and a salt bridge 5 connected to the Luggin tube 2.

Thereafter, the determination vessel 4 was charged with the detergent composition so as to immerse the working electrode 1, the Luggin tube 2 and the counter electrode 3, the reference electrode vessel 6 was charged with a saturated aqueous potassium chloride so as to immerse the calomel reference electrode 7, respectively. The pretreated aluminum film was placed in the determination vessel 4 to begin the determination.

In the potential-current determination device 8, a self-potential was read off every minute.

5. Determination of Sulfur Atom Content in Protective Film
(1) Pretreatment of Determination Sample The wafer of the above-mentioned 2. was subjected to (1) cleaning, (2) rinsing, and (3) drying with nitrogen blow for evaluation of the cleaning process of the above-mentioned 3 as pretreatments.
(2) Analysis Method The pretreated sample was embedded with a resin in the thickness direction of the wafer, and its cross section was etched with an ion polishing device (Ar ion beam, acceleration voltage: 2 kV, illuminating angle: 5.8°), to give a thin film cross section sample (sample thickness: about 70 nm). This thin film cross section sample was subjected to compositional analysis (energy dispersive X-ray spectroscopy: accelerated voltage: 200 kV, current: 30 μA, beam diameter: 2 nm), while observing with a TEM (transmission electron microscope). The compositional analysis was performed at 5 points within 5 nm in the thickness direction from the surface of the protective film on the aluminum wire, and a set of determinations were made in at least three different locations. From the determinations of at least 15 of these points, each of the contents of aluminum atom, oxygen atom and sulfur atom is obtained as an average as expressed in % by weight. The content of sulfur atom is shown in Table 1.

| <Analyzer> | |
|---|---|
| Ion polishing device: | Model 691, accurate polishing device |
| TEM compositional analysis: | Hitachi Analytical Electron Microscope HF-2000 |

TABLE 1

| | Components*1 (% by weight) | pH | Wire Width 500 nm | | Wire Width 180 nm | | Wire Width 110 nm | | Found Self-Potential (V) | Sulfur Atom Content in Protective Film (% by wt.) |
|---|---|---|---|---|---|---|---|---|---|---|
| | | | Cleaning Ability | Corrosion Resistance Against Al Wire | Cleaning Ability | Corrosion Resistance Against Al Wire | Cleaning Ability | Corrosion Resistance Against Al Wire | | |
| Ex. 1 | Oxalic Acid (0.2) Ammonium Sulfate (4.0) | 2.5 | ⊚ | ⊚ | ⊚ | ⊚ | ⊚ | ⊚ | −0.38 | 14 |
| Ex. 2 | Oxalic Acid (0.2) Ammonium Sulfate (10.0) | 2.7 | ○ | ⊚ | ○ | ⊚ | ○ | ⊚ | −0.32 | 17 |
| Ex. 3 | Oxalic Acid (2.0) Ammonium Sulfate (2.0) | 2.1 | ⊚ | ⊚ | ⊚ | ○ | ⊚ | ○ | −0.43 | 5 |
| Ex. 4 | 1-Hydroxyethylidene-1,1-diphosphonic Acid (0.2) Ammonium Sulfate (2.0) | 4.7 | ⊚ | ⊚ | ⊚ | ○ | ⊚ | ○ | −0.41 | 8 |
| Ex. 5 | Sulfuric Acid (0.2) Ammonium Nitrate (4.0) | 1.5 | ⊚ | ⊚ | ⊚ | ⊚ | ⊚ | ⊚ | −0.37 | 12 |
| Ex. 6 | Oxalic Acid (0.2) Sulfuric Acid (0.2) Ammonium Sulfate (4.0) | 2.0 | ⊚ | ⊚ | ⊚ | ⊚ | ⊚ | ⊚ | −0.39 | 14 |
| Ex. 7 | Oxalic Acid (0.2) Ammonium Sulfate (4.0) Diethylene Glycol Monobutyl Ether (30.0) Sorbitol (5.0) | 2.7 | ⊚ | ⊚ | ⊚ | ⊚ | ⊚ | ⊚ | −0.39 | 15 |
| Ex. 8 | 1-Hydroxyethylidene-1,1-diphosphonic Acid (0.2) Ammonium Sulfate (4.0) | 2.8 | ⊚ | ⊚ | ⊚ | ⊚ | ⊚ | ⊚ | −0.38 | 10 |
| Comp. Ex. 1 | Oxalic Acid (0.2) | 1.9 | ○ | ○ | ○ | X | ○ | X | −0.53 | 0 |
| Comp. Ex. 2 | Ammonium Sulfate (4.0) | 5.3 | X | ○ | X | △ | X | X | −0.50 | 0 |
| Comp. Ex. 3 | Ammonium Fluoride (0.5) Dimethylformamide (75.0) | 9.8 | ⊚ | ○ | ⊚ | X | ⊚ | X | −0.64 | 0 |
| Comp. Ex. 4 | Hydroxylamine (20) 2-Amino-2-ethoxyethanol (55) Catechol (5) | 11.7 | ⊚ | ⊚ | ⊚ | △ | ⊚ | △ | −0.93 | 0 |
| Comp. Ex. 5 | Ammonium Fluoride (10.0) Acetic Acid (0.1) Dimethylformamide (45.0) Tetramethylammonium Acetate (3.0) | 8.3 | ⊚ | ○ | X | △ | ⊚ | X | −0.60 | 0 |

Remark
*1The balance is ultrapure water.

It can be seen from the results of Table 1, a sulfur-containing protective film is formed in each of the semiconductor devices obtained in Examples 1 to 8, as compared to those of Comparative Examples 1 to 5, so that there is very little corrosion of aluminum wires and residue generated upon formation of aluminum wires.

Examples 9 and 10

The wafer having a wire width of 180 nm in 2. mentioned above was immersed at 40° C. for 15 minutes in 30 mL of the detergent compositions prepared in Examples 1 and 6, and allowed to stand. Next, rinsing and the evaluation were carried out in the same manner as in 3. mentioned above. The results are shown in Table 2.

TABLE 2

| | Detergent Composition | Cleaning Ability | Corrosion Resistance Against Al Wire |
|---|---|---|---|
| Ex. 9 | Detergent Composition Prepared in Example 1 | ○ | ⊚ |
| Ex. 10 | Detergent Composition Prepared in Example 6 | ⊚ | ⊚ |

It can be seen from the results of Table 2 that the detergent compositions prepared in Examples 1 and 6 are capable of removing most of the residue generated upon the formation of aluminum wire even in a short immersion time of 15 minutes, and that the detergent compositions are excellent in corrosion resistance against the aluminum wire. In addition, since sulfuric acid is used as one of the raw materials for preparing the detergent composition (Example 10), it can be seen that highly excellent cleaning ability can be obtained even in a short period of time.

Test Examples 1 to 3

Detergent compositions having the components shown in Table 3 (numerical values represent % by weight) were prepared. The amount of alumina dissolved by the resulting composition was determined in accordance with the standard test mentioned above. The results are shown in Table 3.

TABLE 3

| | Test Example Nos. | | |
|---|---|---|---|
| | 1 | 2 | 3 |
| Sulfuric acid | 0.3 | — | — |
| Oxalic acid | — | 0.2 | — |
| HEDP | — | — | 0.3 |
| Ammonium Nitrate | 5.0 | — | — |
| Ammonium Sulfate | — | 8.0 | 4.5 |
| Water | 94.7 | 91.8 | 95.2 |
| Amount of Alumina Dissolved (ppm) | 21.3 | 18.6 | 19.8 |

HEDP stands for 1-hydroxyethylidene-1,1-diphosphonic acid.

It can be seen from the results of Table 3 that all of the detergent compositions prepared in Test Examples have an amount of alumina dissolved of 10 ppm or higher.

Taking the detergent compositions used in Examples 1 to 8 and Test Examples 1 to 3 from a different angle, each of the detergent compositions has conjugated bases of a molecular acid and a conjugated acid of a molecular base as shown in Table 4.

TABLE 4

| | Conjugated Bases | Conjugated Acid |
|---|---|---|
| Ex. 1 | Oxalate ion Sulfate ion | Ammonium ion |
| Ex. 2 | Oxalate ion Sulfate ion | Ammonium ion |
| Ex. 3 | Oxalate ion Sulfate ion | Ammonium ion |
| Ex. 4 | 1-Hydroxyethylidene-1,1-diphosphonate ion Sulfate ion | Ammonium ion |
| Ex. 5 | Sulfate ion Nitrate ion | Ammonium ion |
| Ex. 6 | Oxalate ion Sulfate ion | Ammonium ion |
| Ex. 7 | Oxalate ion Sulfate ion | Ammonium ion |
| Ex. 8 | 1-Hydroxyethylidene-1,1-diposphonate ion Sulfate ion | Ammonium ion |
| Test Ex. 1 | Sulfate ion Nitrate ion | Ammonium ion |
| Test Ex. 2 | Oxalate ion Sulfate ion | Ammonium ion |
| Test Ex. 3 | 1-Hydroxyethylidene-1,1-diphosphonate ion Sulfate ion | Ammonium ion |

The semiconductor device of the present invention can be suitably used in the manufacture of electronic parts such as LCD, memory and CPU. Especially, the semiconductor device is suitably used in the manufacture of a highly integrated semiconductor with advanced scale-down.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sulfur-containing detergent composition for cleaning a semiconductor device having an aluminum wire,
wherein said sulfur-containing detergent composition is capable of forming a protective film containing a sulfur atom on a surface of an aluminum film in a protective film-forming test;
the sulfur-containing detergent composition has a pH of from 1 to 5; and
the sulfur-containing detergent composition comprises:
(i) 0.1 to 10% by weight of an acid which is at least one or more selected from the group consisting of oxalic acid, 1-hydroxyethylidene-1,1-diphosphonic acid, sulfuric acid, nitric acid, and phosphonic acid;
(ii) 1 to 20% by weight of a salt of an organic acid, a salt of an inorganic acid, or a mixture thereof, wherein said salt is at least one or more selected from the group consisting of ammonium oxalate, ammonium sulfate, and ammonium nitrate; and
(iii) water in an amount of at least 50% by weight of the detergent composition.

2. The sulfur-containing detergent composition according to claim 1, wherein said protective film has a self-potential of from −0.45 to −0.25V.

3. The sulfur-containing detergent composition according to claim 1, wherein said acid (i) is sulfuric acid alone, or a combination of sulfuric acid and at least one or more selected from the group consisting of oxalic acid, 1-hydroxyethylidene-1,1-diphosphonic acid, nitric acid, and phosphonic acid.

4. The sulfur-containing detergent composition according to claim 1, wherein said salt of an organic acid, said salt of an inorganic acid, or a mixture thereof (ii) is a sulfate alone, or a combination of a sulfate and at least one or more selected from the group consisting of oxalates and nitrates.

5. The sulfur-containing detergent composition according to claim 1, wherein:
(I) the acid is sulfuric acid, and the salt of an inorganic acid is ammonium sulfate, ammonium nitrate, or a mixture thereof;
(II) the acid is both sulfuric acid and oxalic acid, and the salt of an inorganic acid is ammonium sulfate; or
(III) the acid is both 1-hydroxyethylidene-1,1-diphosphonic acid and oxalic acid, and the salt of an inorganic acid is ammonium sulfate.

6. The sulfur-containing detergent composition according to claim 2, wherein an amount of alumina dissolved is 10 ppm or more in a standard test.

7. The sulfur-containing detergent composition according to claim 1, wherein said composition contains 0.1% by weight or less of a fluorine-containing compound.

8. The sulfur-containing detergent composition according to claim 1, wherein said composition contains 0.001% by weight or less of a fluorine-containing compound.

9. The sulfur-containing detergent composition according to claim 1, wherein said composition contains 100 ppb or less of NaOH.

10. The sulfur-containing detergent composition according to claim 1, wherein said composition contains 20 ppb or less of NaOH.

11. The sulfur-containing detergent composition according to claim 1, wherein said composition contains 0.001% by weight or less of a fluorine-containing compound and 20 ppb or less of NaOH.

* * * * *